(12) United States Patent
Shan et al.

(10) Patent No.: US 7,105,442 B2
(45) Date of Patent: Sep. 12, 2006

(54) ASHABLE LAYERS FOR REDUCING CRITICAL DIMENSIONS OF INTEGRATED CIRCUIT FEATURES

(75) Inventors: Hongching Shan, Cupertino, CA (US); Kenny L. Doan, San Jose, CA (US); Jingbao Liu, Sunnyvale, CA (US); Michael S. Barnes, San Ramon, CA (US); Hong D. Nguyen, San Jose, CA (US); Christopher Dennis Bencher, San Jose, CA (US); Christopher S. Ngai, Burlingame, CA (US); Wendy H. Yeh, Mountain View, CA (US); Eda Tuncel, Menlo Park, CA (US); Claes H. Bjorkman, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/154,532

(22) Filed: May 22, 2002

(65) Prior Publication Data
US 2003/0219988 A1 Nov. 27, 2003

(51) Int. Cl.
*H01L 21/44* (2006.01)
*H01L 21/31* (2006.01)
*H01L 21/469* (2006.01)

(52) U.S. Cl. .................... 438/681; 438/758
(58) Field of Classification Search ............. 438/681, 438/758, 942, 945, 951, 952, 551, 556
See application file for complete search history.

(56) References Cited

U.S. PATENT DOCUMENTS

| 5,431,770 A | 7/1995 | Lee et al. ............ 156/653.1 |
| 5,656,533 A | 8/1997 | Kim ...................... 438/396 |
| 5,811,315 A | 9/1998 | Yindeepol et al. ........ 437/62 |
| 5,932,491 A | 8/1999 | Wald et al. ............. 438/734 |
| 5,976,927 A | 11/1999 | Hsieh et al. ............ 438/239 |

(Continued)

FOREIGN PATENT DOCUMENTS

WO   WO 00/19508   4/2000

OTHER PUBLICATIONS

J. Jasper, "Sloped etching of highly phosphorous doped polysilicon developed with response surface methodology", SPIE, vol. 1803(1992), pp. 13-23.

*Primary Examiner*—Walter L. Lindsay, Jr.
(74) *Attorney, Agent, or Firm*—Michaelson & Associates

(57) ABSTRACT

A method is described for decreasing the critical dimensions of integrated circuit features in which a first masking layer (101) is deposited, patterned and opened in the manner of typical feature etching, and a second masking layer (201) is deposited thereon prior to etching the underlying insulator. The second masking layer is advantageously coated in a substantially conformal manner. Opening the second masking layer while leaving material of the second layer on the sidewalls of the first masking layer as spacers leads to reduction of the feature critical dimension in the underlying insulator. Ashable masking materials, including amorphous carbon and organic materials are removable without CMP, thereby reducing costs. Favorable results are also obtained utilizing more than one masking layer (101, 301) underlying the topmost masking layer (302) from which the spacers are formed. Embodiments are also described in which slope etching replaces the addition of a separate spacer layer. Substructures formed in the fabrication process are also described. Spacers are also shown to be favorably employed in making feature-in-feature structures.

8 Claims, 8 Drawing Sheets

U.S. PATENT DOCUMENTS

| | | | |
|---|---|---|---|
| 6,008,123 A | 12/1999 | Kook et al. | 438/639 |
| 6,018,179 A | 1/2000 | Gardner et al. | 257/336 |
| 6,027,861 A | 2/2000 | Yu et al. | 430/316 |
| 6,121,123 A | 9/2000 | Lyons et al. | 438/585 |
| 6,121,155 A | 9/2000 | Yang et al. | 438/725 |
| 6,127,278 A | 10/2000 | Wang et al. | 438/719 |
| 6,133,129 A | 10/2000 | Xiang et al. | 438/585 |
| 6,137,182 A * | 10/2000 | Hause et al. | 257/774 |
| 6,156,485 A | 12/2000 | Tang et al. | 430/313 |
| 6,200,866 B1 * | 3/2001 | Ma et al. | 438/299 |
| 6,210,866 B1 | 4/2001 | Furukawa et al. | 430/313 |
| 6,221,777 B1 | 4/2001 | Singh et al. | 438/692 |
| 6,248,654 B1 | 6/2001 | Lee et al. | 438/597 |
| 6,255,147 B1 | 7/2001 | Buynoski | 438/164 |
| 6,277,544 B1 | 8/2001 | Singh et al. | 430/313 |
| 6,287,967 B1 * | 9/2001 | Hsieh et al. | 438/664 |
| 6,319,822 B1 * | 11/2001 | Chen et al. | 438/637 |
| 6,319,824 B1 * | 11/2001 | Lee et al. | 438/639 |
| 6,337,275 B1 * | 1/2002 | Cho et al. | 438/675 |
| 6,342,452 B1 * | 1/2002 | Coronel et al. | 438/710 |
| 6,643,008 B1 * | 11/2003 | Stirton et al. | 356/237.5 |
| 6,649,541 B1 * | 11/2003 | Evans et al. | 438/791 |
| 6,660,542 B1 * | 12/2003 | Stirton | 438/16 |
| 6,780,571 B1 * | 8/2004 | Choi | 430/322 |
| 6,803,315 B1 * | 10/2004 | Dokumaci et al. | 438/692 |

* cited by examiner

US 7,105,442 B2

ASHABLE LAYERS FOR REDUCING CRITICAL DIMENSIONS OF INTEGRATED CIRCUIT FEATURES

BACKGROUND OF THE INVENTION

1. Field of Invention

The invention relates to processes and substructures arising in the manufacture of integrated circuits and, more particularly, to processes, materials and substructures for reducing the critical dimensions of integrated circuit features.

2. Description of the Prior Art

Reducing the critical dimensions ("CDs") of integrated circuit features is an important problem in the continuing efforts to increase the functionality of integrated circuits ("ICs"). Several lines of attack are possible. Reducing CDs by improving the mechanical and/or optical performance of photolithography requires improvement of mechanical steppers as well as improved printing (exposing and developing). Improving mechanical steppers can be economically problematic, requiring abandonment of existing steppers and loss of the capital investment.

Improved printing typically includes the use of exposing radiation with shorter wavelengths. Present IC photolithography systems typically use deep ultraviolet ("DUV") radiation with a wavelength of 248 nm (nm=nanometer=$10^{-9}$ meter), conveniently obtained from KrF excimer lasers. More advanced systems make use of ArF excimer lasers with a wavelength of 193 nm. However, the use of even shorter wavelengths (such as the $F_2$ laser with a wavelength of 157 nm) is handicapped by the lack of suitable optical materials from which lenses or other optical components can be manufactured. In summary, improving photolithography by the use of shorter wavelengths involves both the financial burden of investment in replacement photolithography equipment and meeting the technical challenges of manipulating very short wavelengths.

Techniques have been described for reducing the CDs achievable with existing steppers and photolithography systems. That is, CD reduction is obtained by additional and/or different processing steps making use of presently-employed steppers and photolithography. CD reduction by the use of amorphous silicon spacer layers has been described by Kook et al (U.S. Pat. No. 6,008,123). However, it is often necessary to remove the hardmasks, spacers or other layers deposited to facilitate feature fabrication. Amorphous silicon belongs to a class of materials that are removable only with difficulty. Chemical mechanical planarization ("CMP") is required to remove the materials described by Kook, which requires relatively expensive consumables and processing. Therefore, reducing CDs by means of materials removable by less expensive processing than CMP would simplify IC manufacturing and reduce costs.

Thus, a need exists in the art for achieving a reduction in CDs while avoiding the expense of CMP.

SUMMARY OF THE INVENTION

Accordingly and advantageously, the invention provides for a reduction in critical dimensions of integrated circuit features, particularly a reduction in the critical dimensions of trenches and holes formed in integrated circuit insulating layers. One or more masking layers comprising ashable materials are deposited on the insulator, patterned and opened. A topmost masking layer is deposited, advantageously in a substantially conformal manner, coating horizontal and vertical surfaces of the previously-open mask(s) as well as coating exposed horizontal surfaces of the insulator. Anisotropic etching is performed, typically dry etching, to open the topmost masking layer, thereby exposing the insulator to subsequent etching while leaving spacer material on the vertical sidewalls of previously opened masking layer(s). Amorphous carbon and organic materials are advantageously employed.

Other embodiments of the invention make use of thick masking layers slope etched so as to create positively sloped sidewalls and, hence, a reduction in CDs. Amorphous carbon, organic materials or other ashable materials are advantageously employed as thick masking layers.

The invention also improves fabrication processes for feature-in-feature structures as employed, for example, in dual damascene. A feature, hole or trench, is fabricated in an insulator layer by any convenient procedure. A masking layer is deposited on the insulator, typically in a substantially conformal manner, coating both horizontal surfaces and the vertical sidewalls of the insulator and the pre-existing feature. The masking layer is then opened by an anisotropic etching procedure, typically dry etch, exposing the bottom of the pre-existing feature to further etching while leaving spacer materials on the sidewalls. Etching the exposed insulator followed by removal of the sidewall masking material results in a trench-in-trench, or hole-in-hole, if the pre-existing feature was a trench or hole, respectively.

These and other advantages are achieved in accordance with the present invention as described in detail below.

BRIEF DESCRIPTION OF THE DRAWINGS

The techniques of the present invention can readily be understood by considering the following detailed description in conjunction with the accompanying drawings, in which.

To facilitate understanding, identical reference numerals have been used, where possible, to designate identical elements that are common to the figures. The drawings are not to scale.

DETAILED DESCRIPTION

After considering the following description, those skilled in the art will clearly realize that the teachings of the invention can be readily utilized in the fabrication of integrated circuits.

In the fabrication of integrated circuits, it is often difficult to achieve adequate etching selectivity between a layer of developed photoresist and the layer to be etched, typically an insulator. One approach has been to interpose a relatively thin masking layer or hardmask between the photoresist and the insulator as described, for example, by Yu et al (U.S. Pat. No. 6,027,861). Thus, the patterned layer of photoresist is used only to etch the masking layer to breakthrough while the patterned masking layer is subsequently used to etch the desired pattern into the underlying insulator to the required depth. A typical use of a hardmask is depicted in FIGS. 1a–1e.

FIGS. 1a–1e are schematic, cross-sectional views of IC substructures created by the fabrication processes described. In most cases, the figures represent a cross-sectional view of a general opening in the IC substituent layer, either a trench or a hole without distinction.

The layer to be patterned, 102, lies on substrate 103. In the fabrication of ICs, layer 102 is typically an insulator and most commonly a silicon dioxide insulator (e.g. $SiO_2$). However, the techniques described herein are not limited to patterning insulators but can also be applied to the patterning of conductive layers (polysilicon and metals, among others), as well as other materials. To be concrete in our description we refer to 102 as the insulator or oxide recognizing thereby that this is by way of illustration and not limitation. The techniques described herein are readily applicable to the patterning of other IC substituent layers and are included within the scope of the present invention.

Substrate 103 can be the semiconductor substrate providing the active electronic functionality to the IC or can be one or more layers of insulators and/or conductors resulting from prior steps in the IC fabrication process. All such substrates are commonly referred to herein as "substrate" for economy of language. Furthermore, the boundary between 102 and 103 need not be flat but typically contains structure resulting from prior patterning, deposition and/or planarization steps. For simplicity of depiction, such structure (if any) is omitted from the figures.

Figure 1A:
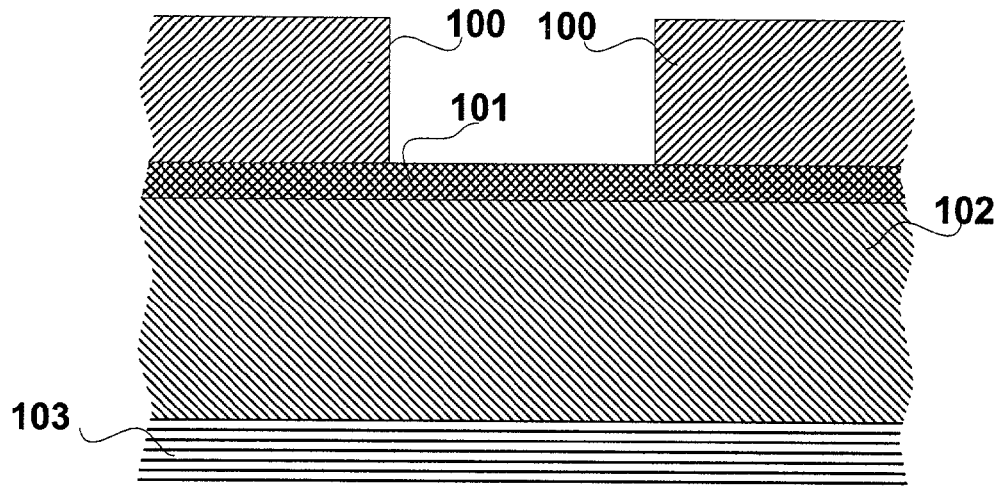
FIGS. 1a–1e depict in schematic cross-sectional view typical steps in using a masking layer to etch a feature.
Figure 1B:
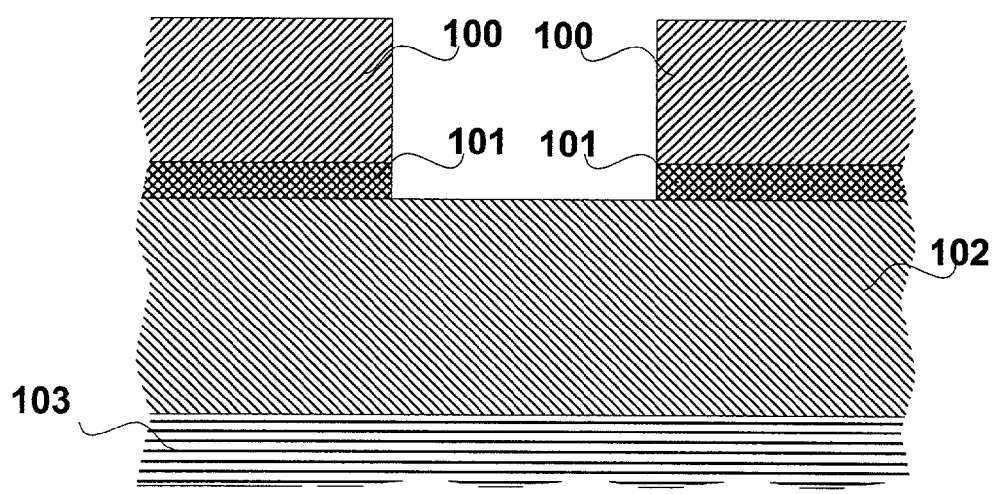

A relatively thin hardmask, 101, is used between photoresist and insulator such that developed photoresist, 100, need only define the feature to be etched in the hardmask rather than define the feature during the entire period required for etching the insulator, 102. Following development of the photoresist as in FIG. 1a, the hardmask is etched to breakthrough or opened, as depicted in FIG. 1b.

Figure 1C:
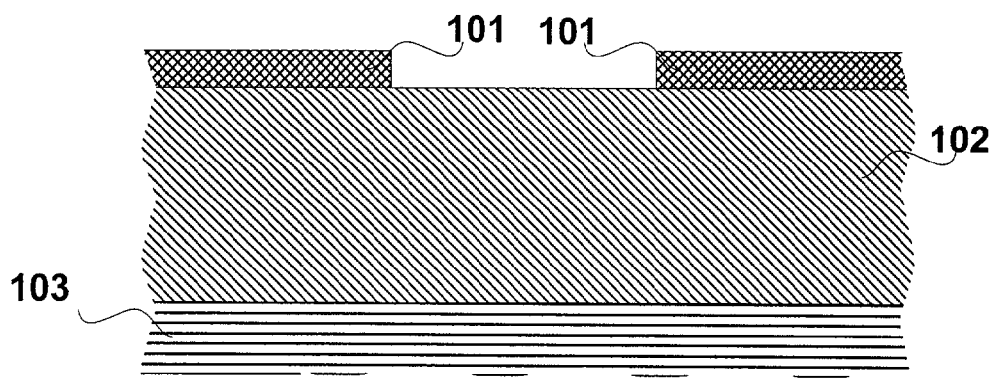
Figure 1D:
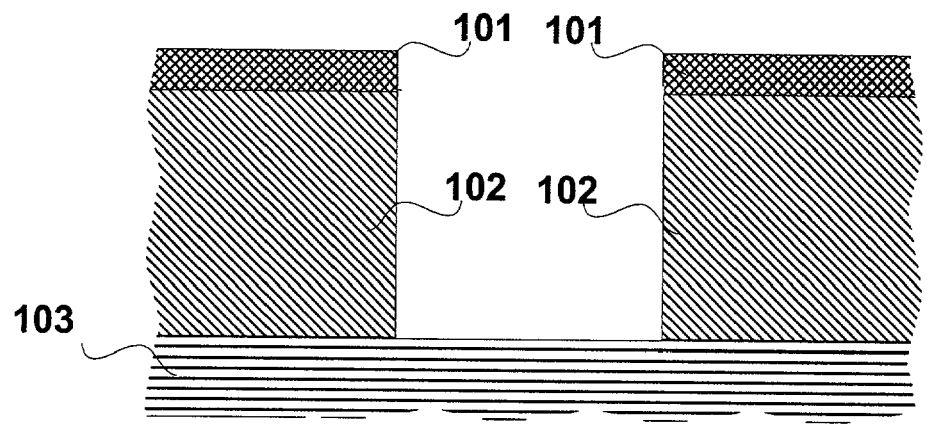
Figure 1E:
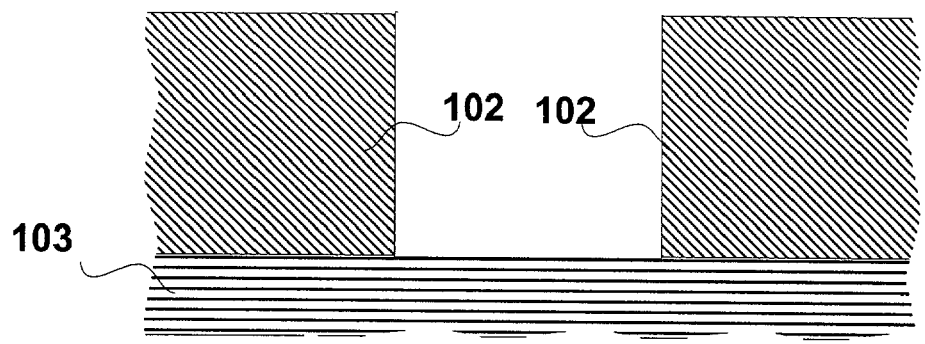

Following the opening of hardmask 101 (that is, the step from FIGS. 1a to 1b, "mask opening," abbreviated as 1a→1b) any residual photoresist is stripped (1b→1c), the insulator 102 is etched to create the desired feature, 1c→1d, and the hardmask can then be lifted, 1d→1e. The feature thus created in the insulator as depicted in FIG. 1e can be etched further as in some types of dual damascene processing, metal or other conductors deposited therein, or other processing steps performed.

Figure 2A:
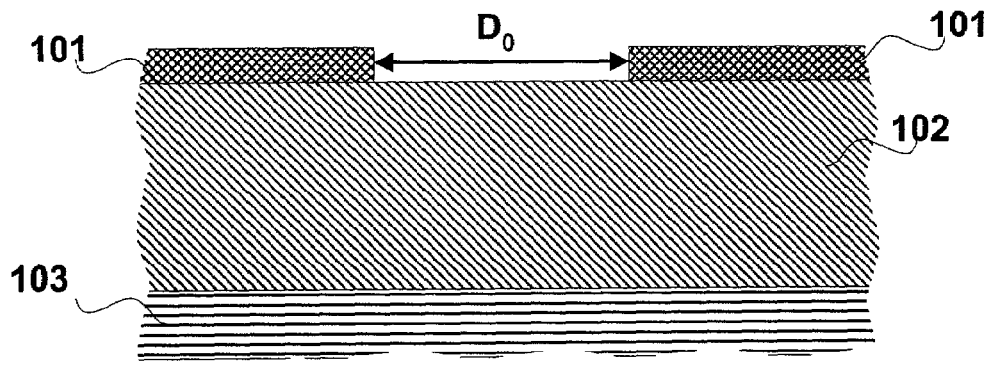
FIGS. 2a–2e depict in schematic cross-sectional view typical steps in using a second masking or spacer layer for reducing CDs.
Figure 2B:
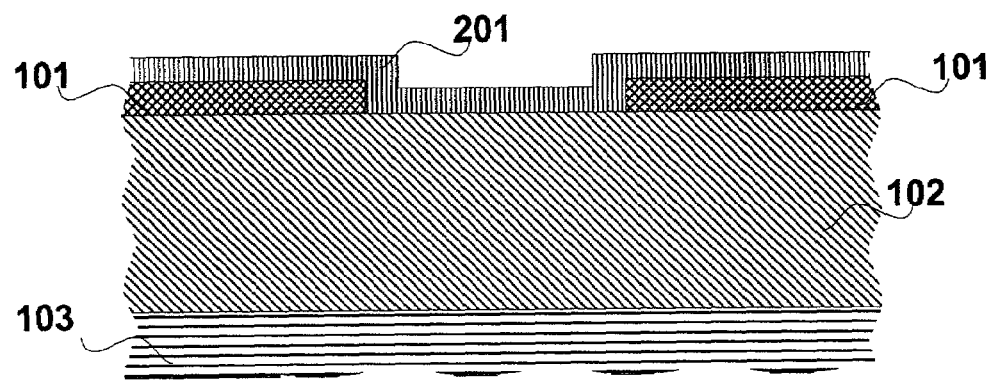

FIGS. 2a–2e depict a method of shrinking CDs by the use of a second masking layer (or "spacer") on the first masking layer, that is on the hardmask. FIGS. 1c and 2a both depict substrate 103, insulator 102, and opened hardmask 101. The opening of hardmask 101 permits the etching of a feature having a CD of $D_0$ where $D_0$ is a trench width or a via diameter depending on the particular feature being etched.

A second masking layer, 201, is deposited on the substructure of FIG. 2a in step 2a→2b. It is advantageous that layer 201 be deposited approximately conformally ("step coating") using such techniques as atomic layer deposition, chemical vapor deposition, among other step coating techniques. However, in practice, it is not always possible to achieve good step coating. The vertical sidewalls of mask 201 may coat to a substantially different thickness than the horizontal field surfaces, typically thinner. The disparity in coating thickness between sidewall and field depends on several factors including the aspect ratio of the feature, the particular coating technique, the coating material, the materials comprising the insulator and masking layer to be coated, among other factors. However, CD reduction is still achievable pursuant to the present invention even though sidewall coating is thinner than field coating. For such cases, CD reduction is not as great as it might be for step coating, but a CD reduction is achieved nevertheless. Reproducible sidewall coatings are typically more important in achieving useful CD reduction than are true step coatings.

Figure 2C:
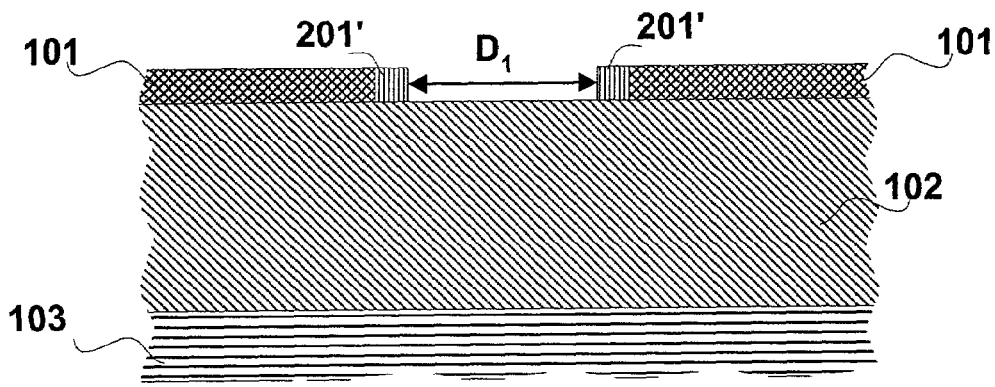

Mask 201 is etched by an anisotropic etching technique that preferentially etches in the direction normal to the plane of the insulator layer, step 2b→2c producing an IC substructure substantially as depicted in FIG. 2c. Typically, dry etching techniques are advantageously anisotropic with a relatively small lateral etch ratio. An ideal anisotropic etch removes material normal to the horizontal surfaces of hardmask and oxide while leaving untouched mask material 201' lying along the sidewalls of the previously etched opening $D_0$ (that is, zero lateral etch ratio). The resulting opening has dimension $D_1 < D_0$ due to the spacer effect of unetched sidewall material, 201'.

Figure 2D:
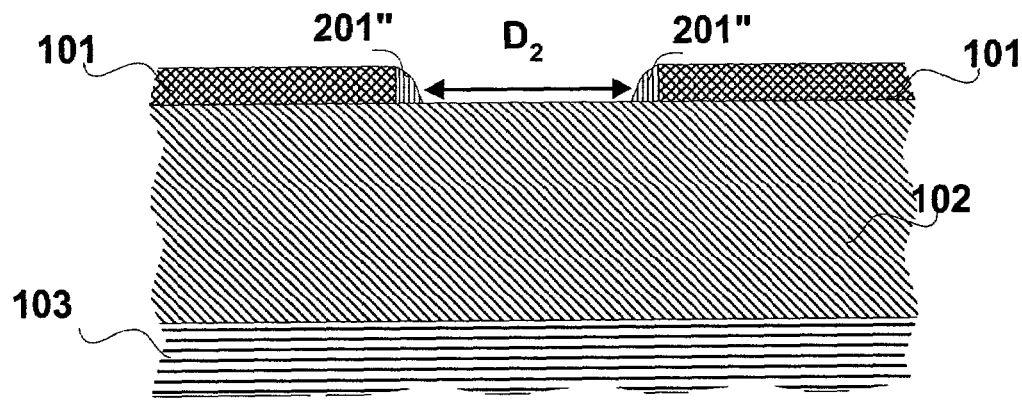
Figure 2E:
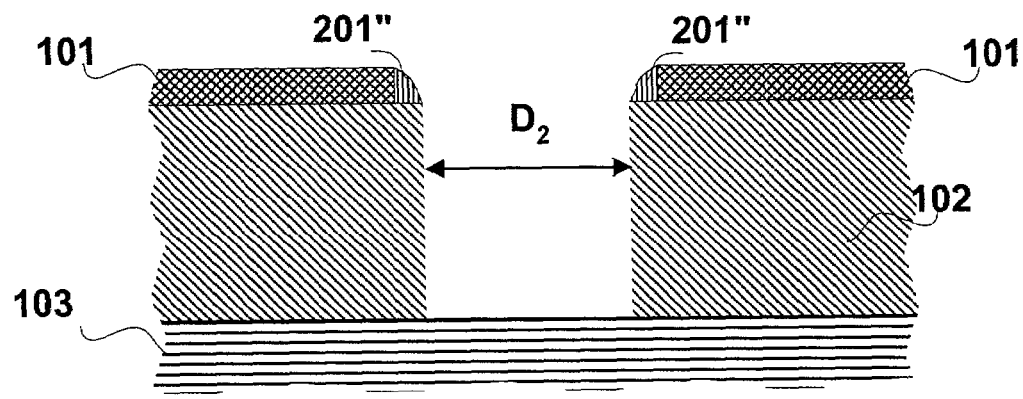

Ideal anisotropic etching as depicted in step 2b→2c is not typically achieved in practice. More realistically, RIE (reactive ion etching) or a similar dry etching technique etches some of the sidewall material, typically more so near the top of the opened hardmask than near the bottom. The resulting sidewall structure is depicted in FIG. 2d as 201". Such sidewall etching can have the effect of increasing critical dimension $D_1$ to $D_2$ wherein $D_1 \leq D_2$. Nevertheless, the critical dimension $D_2$ is inherently less than $D_0$ so long as sidewall material remains at the bottom of the feature. Etching of the insulator provides a feature having critical dimension $D_2 < D_0$, as depicted in FIG. 2e. Thus, a reduction in CD is achieved from $D_0$ to $D_2$.

The reduction of CDs from the use of spacers is not limited to a single spacer layer. That is, the substructure of FIG. 2d can be coated with a third layer of the same or different masking material and anisotropically etched, further decreasing the CD. Multiple repetitions of masking and etch, steps 2b→2c→2d can be performed prior to insulator etching until the desired CD is obtained. This is one way to overcome relatively thin sidewall deposits (or a large lateral etch ratio), but at the cost of additional processing steps.

Other embodiments include the use of more than one masking layer prior to the deposition of the spacer layer. In principle, multiple masking layers can be deposited prior to the spacer layer but only two are typically used in practice, as depicted schematically in FIGS. 3a–3c. One motivation for using two masking layers arises in circumstances in which the second (upper) masking layer is used as a hardmask for the opening of the first (lower) masking layer. That is, inadequate etching selectivity may be present between the photoresist and the first masking layer so an additional masking layer is interposed. The photoresist is thus used to open the second masking layer which in turn is used to open the first masking layer. The substructure of FIG. 3a results from depositing two masking layers, 101 and 301, on insulator 102, coating with photoresist 100, exposing and developing and opening both masking layers. Following stripping of the photoresist, a third masking layer, 302, is deposited to serve as the spacer. Layer 302 is advantageously step coated as depicted in FIG. 3b but accurate step coating is not a requirement. Following opening of mask layer 302, etching of the insulator can be performed, resulting in the feature of FIG. 3c. A CD reduction from $D_0$ to $D_2$ occurs that is substantially twice the width of the sidewall of layer 302 at the time etching of insulator 102 begins.

Figure 3A:
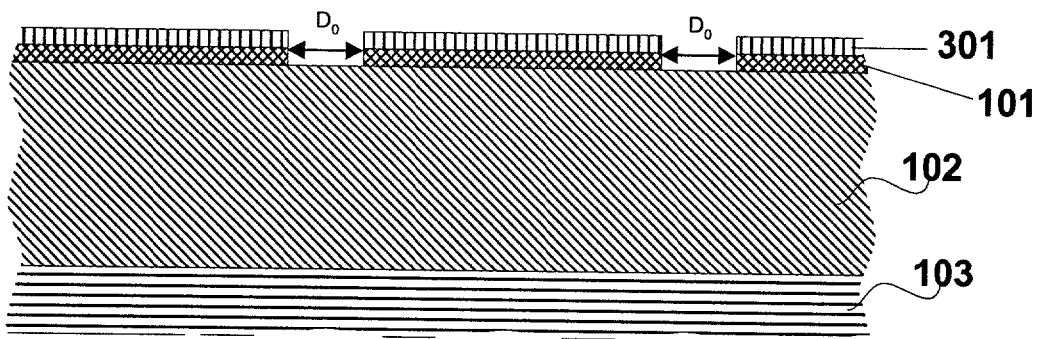
FIGS. 3a–3c depict in schematic cross-sectional view typical steps in using multiple masking layers for reducing CDs.
Figure 3B:
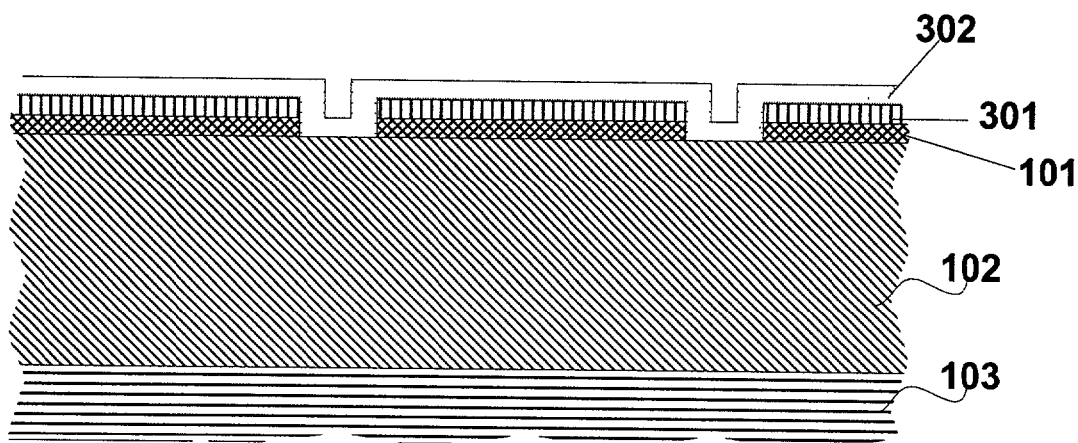
Figure 3C:
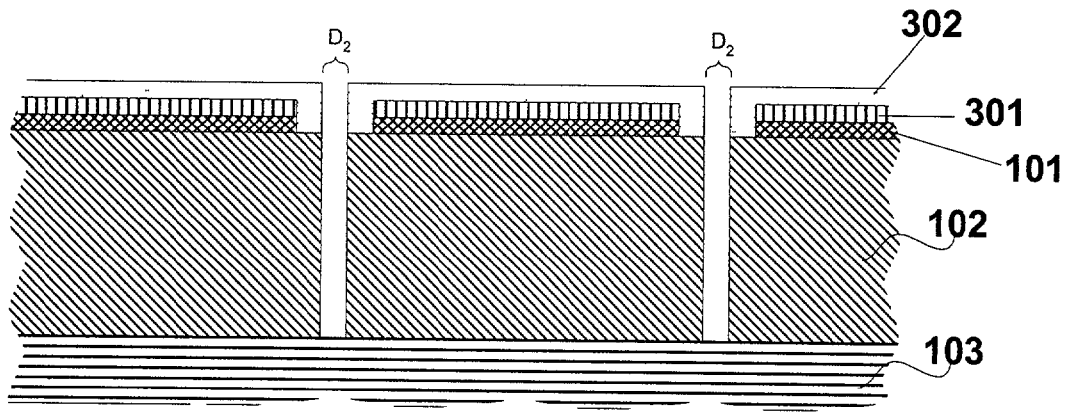

To function as a practical masking layer, the material (or combination of materials) of 101 needs to possess adequate etching selectivity with respect to the photoresist such that it can be patterned with a precise feature (as depicted for a single masking material in FIG. 1b and for two masking materials in FIG. 3a). Further, 101 needs to possess adequate etching selectivity with respect to the insulator material 102 such that the feature of the required depth can be etched into 102 as depicted in FIG. 1d. Distinct etching steps with different procedures and parameters can be used for mask opening 1a→1b and for insulator etch 1c→1d so that the etching rate of the mask layer can be different in each step even in cases in which a single masking material is employed (as in FIG. 1). However, in practice the masking layer (or layers) also need to be compatible with other IC materials, not unduly challenging to process and, in some cases, serve multiple functions within the IC. Indeed, these properties not directly related to the etching characteristics of the mask often make the difference between a useful masking layer and an impractical one. While the general idea of spacers as a means to shrink CDs has been reported (for example, Kook et al U.S. Pat. No. 6,008,123) materials compatibility needs to be maintained to provide practical IC fabrication processes.

"Compatible materials" in the context of IC fabrication and as used herein means materials that possess characteristics that do not seriously interfere with the electronic functionality, reliability or manufacturability of the IC. Such characteristics include conductivity (for current-carrying elements), dielectric constant (for insulators), lithographically compatible optical properties, acceptable electromigration characteristics, acceptable processing times, temperatures and environments, good adhesion of contacting materials, ease of removal and/or planarization, among numerous other characteristics.

Amorphous silicon spacer and hardmask layers as described by Kook et al (supra) are removable only with difficulty, typically by means of mechanical abrasion and chemical etching in CMP. Such materials may be useful when the spacer and hardmask layers need not be removed but can remain in place in the IC during further processing. However, in may applications removal of the hardmask and spacer layers is necessary before further IC processing can occur. For such cases, readily removable materials are advantageous.

The removal of IC layers by means of a plasma or other dry process ("ashing") is considerably less expensive and more convenient than removal by CMP. The present invention relates to ashable layers for use as masking and spacer layers in the reduction of CDs. Specifically, "ashing" is used herein to indicate dry stripping processes including plasma etching (typically utilizing an oxidizing plasma such as $O_2$, ammonia, water, $H_2O_2$, among other plasmas). However, non-plasma dry stripping processes are also included, such as etching with oxidizing gases such as ozone, among other dry stripping procedures.

Ashable materials include carbon (in its various solid forms, graphite, diamond, diamond-like, amorphous, among others) and other organic materials such as hydrocarbon-containing polymers. In particular, amorphous carbon layers are advantageously used for masking layers pursuant to some embodiments of the present invention. In addition to amorphous carbon, various organic materials can advantageously be used as masking layers pursuant to some embodiments of the present invention, including materials used for BARC layers (bottom-anti-reflection-coating layers), among others.

The present inventors find that amorphous carbon is an advantageous material for masking and/or spacer layers in that it is readily ashed by dry etching processes without affecting other IC layers and thereby avoids the expense of CMP removal. Plasma ashing with $O_2$ is found to be a favorable ashing technique.

Additionally, amorphous carbon is found to be a particularly advantageous material in having a high etching selectivity with respect to typical photoresists. While amorphous carbon tends to produce thin side walls in many deposition techniques, this reduces but does not eliminate the achievable reduction in CDs. Atomic layer deposition of amorphous carbon layers is found to produce adequate step coverage and further sidewall thickness can be obtained with additional coating steps.

Techniques have been described for etching IC layers to give sloped rather than essentially perpendicular vertical sidewalls. Slope etching can be used in addition to, or in place of, spacer layers to reduce CDs pursuant to some embodiments of the present invention.

Figure 5A:
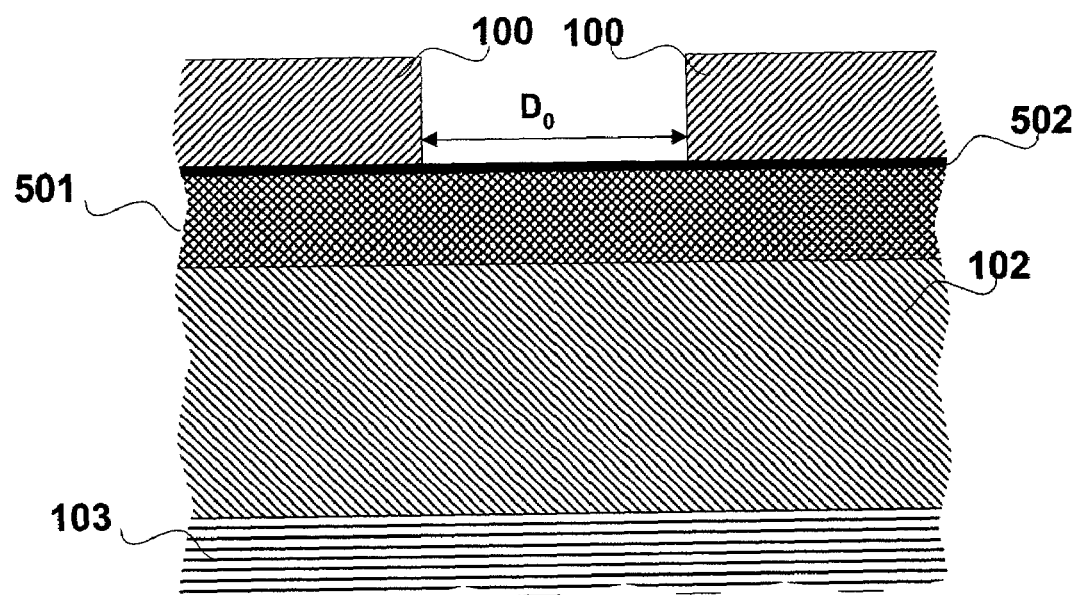
FIGS. 5a–5b depict in schematic cross-sectional views typical steps in using slope etching for reducing CDs.
Figure 5B:
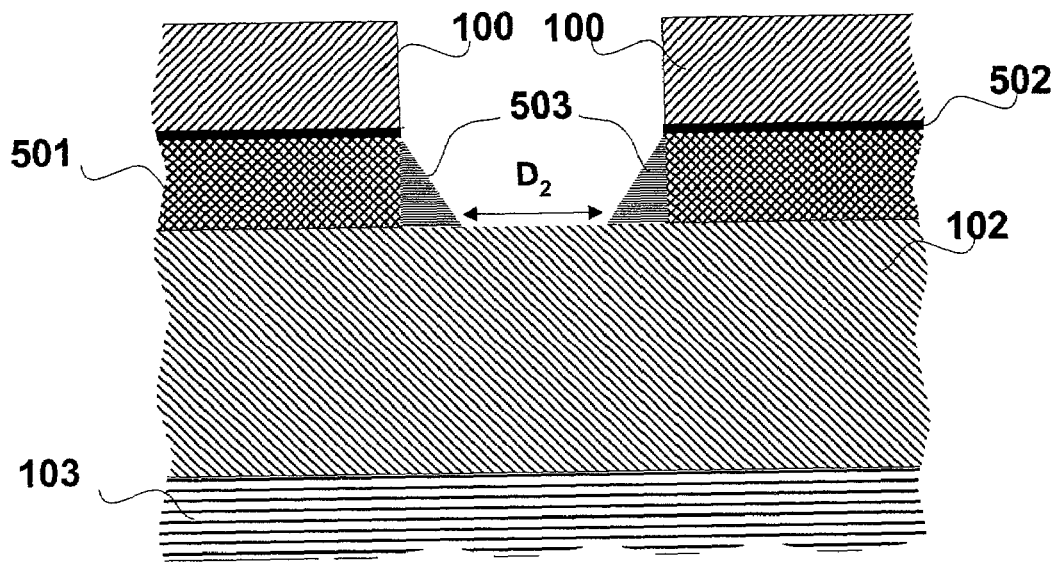

FIG. 5a depicts an insulator to be etched, 102, having a relatively thick layer of a first masking layer coated thereon, 501. Layer 501 is typically amorphous carbon pursuant to some embodiments of the present invention. Due to the relative thickness of 501, it is typical that a second masking layer will be used, 502, to facilitate opening of masking layer 501. A thin layer of SiON (approximately 10 nm) is a typical material for second masking layer, 502. Slope etching of the first masking layer is typically performed by means of a plasma etch forming a positive slope as depicted schematically in FIG. 5b. "Positive slope" indicates $D_0 > D_2$.

Positive slope etching typically is performed by means of a plasma that deposits a sidewall material, 503, while etching the masking layer 501. Typical slope etching plasmas contain oxygen, a diluent and a carbon compound that reacts and deposits to form 503. Typically, the carbon compound will be a fluorohydrocarbon with the general formula $C_xH_yF_z$. Typical diluents include $N_2$, Ar, He, among others. For example, $O_2/N_2/CHF_3$ plasmas are advantageously employed for slope etching. By this means it is possible to reduce the CD from typically $D_0 \approx 0.13$ μm to $D_2 \approx 0.07$ μm (1 μm=$10^{-6}$ meter)

Feature-in-Feature

Figure 4A:
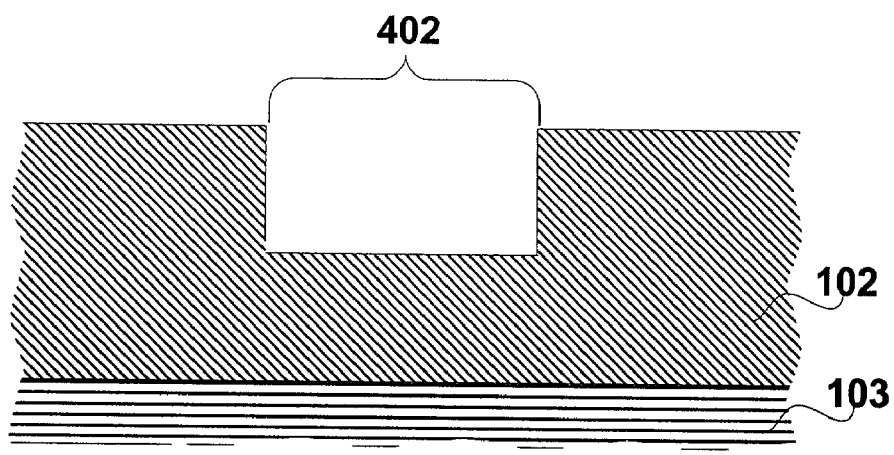
FIGS. 4a–4d depict in schematic cross-sectional view typical steps in fabricating a feature-in-feature.
Figure 4B:
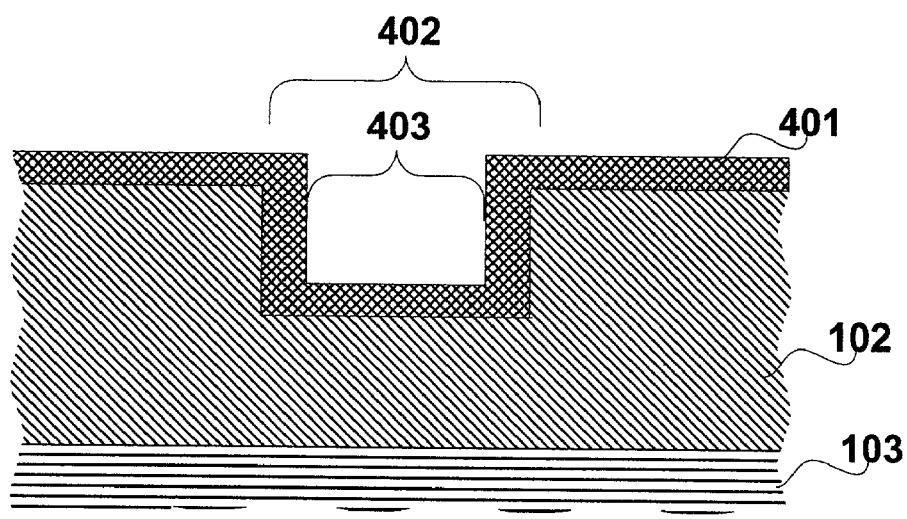
Figure 4C:
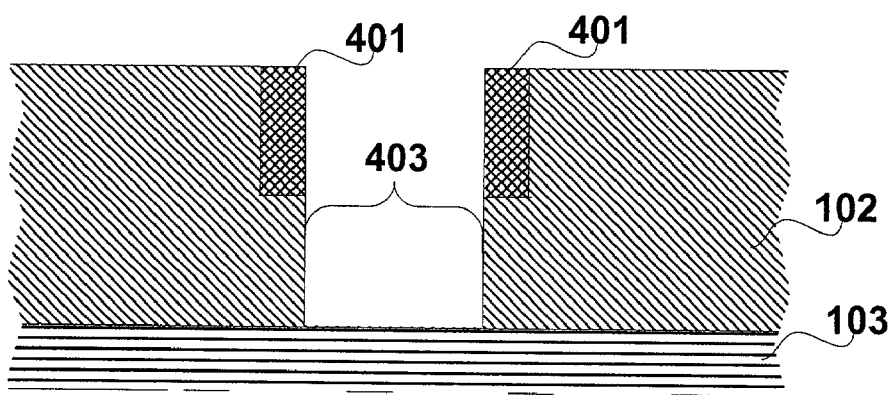
Figure 4D:
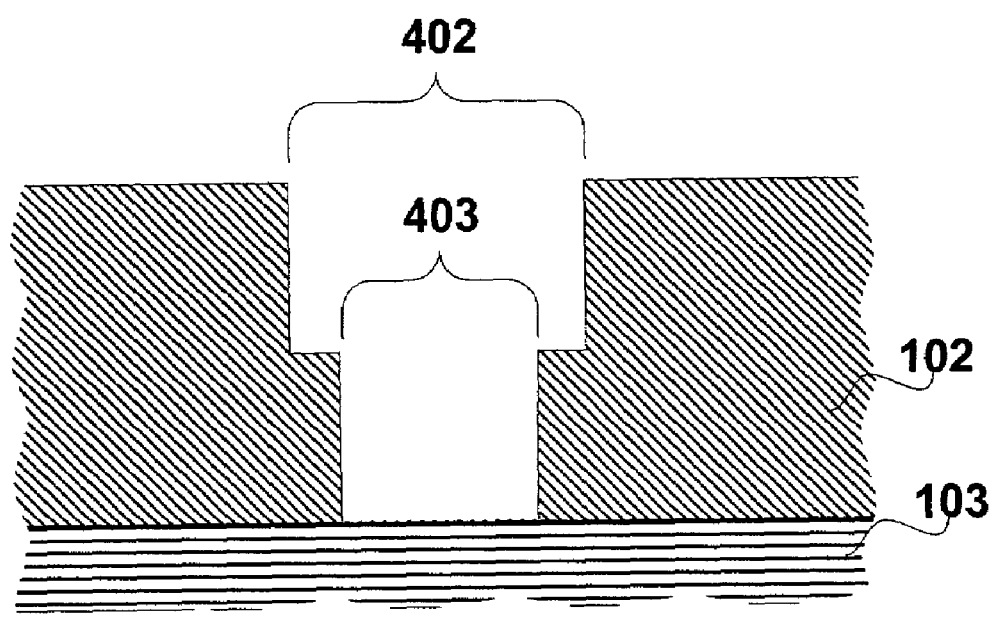

The use of masking layers as described herein permits efficient fabrication of trench-in-trench features as would occur, for example, in some dual damascene IC substructures. FIG. 4a depicts a trench, 402, fabricated in insulator 102 by techniques described elsewhere herein or by other techniques known in the art. A mask layer is then deposited, 401. Advantageously, 401 is deposited substantially conformally as depicted in FIG. 4b, although this is not required as described in detail above. Thinner sidewalls for layer 401 lead to a larger width for internal trench 403 which may be desirable in some circumstances. Etching 401 to breakthrough followed by etching of insulator 102 leads to the trench-in-trench structure of FIG. 4c. Removal of 401 sidewalls in FIG. 4c leads to a trench-in-trench structure available for metallization or further processing. These procedures can also be used for hole-in-hole fabrication (collectively called "feature-in-feature") although trench-in-trench are likely to be the more useful structures in practice.

Although various embodiments which incorporate the teachings of the present invention have been shown and described in detail herein, those skilled in the art can readily devise many other varied embodiments that still incorporate these teachings.

The invention claimed is:

1. A method of forming an opening in a substituent layer of an integrated circuit comprising:
   a) coating said substituent layer with one or more masking layers; and,
   b) photolithographically patterning said one or more masking layers; and,
   c) coating said patterned one or more masking layers with a topmost masking layer wherein said topmost masking layer coats the exposed surfaces of said substituent layer and coats the vertical sidewalls and horizontal surfaces of said patterned one or more masking layers; and,
   d) etching said topmost masking layer so as to open said topmost masking layer, exposing thereby said substituent layer while leaving spacers on said vertical sidewalls of said patterned one or more masking layers; and,
   e) etching an opening in said substituent layer wherein the critical dimension of said opening is reduced from the critical dimension of said patterned one or more masking layers by the thickness of said spacers; and
   wherein at least one of said one or more masking layers and said topmost masking layers comprise amorphous carbon.

2. A method as in claim 1 wherein said coating of said topmost masking layer is substantially conformal.

3. A method as in claim 1 wherein said etching of said topmost layer is by an oxidizing plasma.

4. A method as in claim 1 wherein said etching of said topmost masking layer in step (d) is slope etching.

5. A method of forming a feature in a pre-existing feature of a substituent layer of an integrated circuit comprising:
   a) coating said substituent layer and said feature therein with a masking layer wherein said masking layer coats the exposed surfaces of said substituent layer and coats the vertical sidewalls and horizontal surfaces of said pre-existing feature; and,
   b) etching said masking layer so as to open said masking layer, exposing thereby said substituent layer at the bottom of said pre-existing feature while leaving spacers on said vertical sidewalls of said pre-existing feature and,
   c) etching a feature in said substituent layer at the bottom of said pre-existing feature
   wherein said masking layer comprises amorphous carbon.

6. A method as in claim 5 wherein said feature is a trench formed in a pre-existing trench.

7. A method as in claim 5 wherein said feature is a hole formed in a pre-existing hole.

8. A method as in claim 5 wherein said etching of said masking layer in step (b) is slope etching.

* * * * *